United States Patent
Zwijze et al.

(10) Patent No.: US 11,917,799 B2
(45) Date of Patent: Feb. 27, 2024

(54) SYSTEM AND METHOD FOR COOLING HIGH POWER ELECTRICAL SYSTEMS

(71) Applicant: Sensata Technologies, Inc., Attleboro, MA (US)

(72) Inventors: Robert Zwijze, Vriezenveen (NL); Zeno Van Veen, Bad Bentheim (DE); Jan Boldewijn, Vriezenveen (NL); Erik De Wit, Enschede (NL); Arnout G. Van den Bos, Deurningen (NL)

(73) Assignee: SENSATA TECHNOLOGIES, INC., Attleboro, MA (US)

( * ) Notice: Subject to any disclaimer, the term of this patent is extended or adjusted under 35 U.S.C. 154(b) by 0 days.

(21) Appl. No.: 17/555,986

(22) Filed: Dec. 20, 2021

(65) Prior Publication Data

US 2023/0011070 A1    Jan. 12, 2023

Related U.S. Application Data

(60) Provisional application No. 63/220,755, filed on Jul. 12, 2021.

(51) Int. Cl.
*H05K 7/20*    (2006.01)

(52) U.S. Cl.
CPC ..... *H05K 7/20927* (2013.01); *H05K 7/20509* (2013.01)

(58) Field of Classification Search
CPC ............... H05K 7/20927; H05K 7/20509
See application file for complete search history.

(56) References Cited

U.S. PATENT DOCUMENTS

| | | | |
|---|---|---|---|
| 7,417,857 B2 * | 8/2008 | Rondier | H05K 7/20927 174/15.1 |
| 8,085,538 B2 * | 12/2011 | Noshadi | H05K 7/20872 361/699 |
| 10,141,862 B1 * | 11/2018 | Chen | H05K 7/2089 |
| 2006/0011326 A1 | 1/2006 | Yuval | |
| 2016/0322280 A1 | 11/2016 | Schmit et al. | |
| 2016/0322333 A1 | 11/2016 | Fuergut et al. | |
| 2018/0090417 A1 | 3/2018 | Gutala et al. | |

(Continued)

FOREIGN PATENT DOCUMENTS

| | | | | |
|---|---|---|---|---|
| EP | 2701190 A2 * | 2/2014 | | H01L 23/473 |
| WO | WO-2021145361 A1 * | 7/2021 | | H01M 10/02 |
| WO | 2023287449 A1 | 1/2023 | | |

OTHER PUBLICATIONS

EP 2701190 Translation.*

(Continued)

*Primary Examiner* — Mukundbhai G Patel
(74) *Attorney, Agent, or Firm* — Mark H. Whittenberger; Holland & Knight LLP

(57) ABSTRACT

Embodiments included herein are directed towards an apparatus and method for manufacturing an electrical cooling apparatus. The method may include forming a first entirely solid metal plate to generate an enclosure. The method may also include affixing a bottom metal plate to the first entirely solid metal plate, the bottom metal plate may define a channel system. The bottom metal plate may include one or more inlet openings into the channel system, where the one or more inlet openings are configured to allow coolant to enter or exit the channel system.

20 Claims, 8 Drawing Sheets

(56) References Cited

U.S. PATENT DOCUMENTS

2020/0072565 A1 3/2020 Klaba et al.

OTHER PUBLICATIONS

WO 2021145361 Translation.*
Publication of International Application issued in PCT/US2021/064436 on Jan. 19, 2023.
International Search Report and Written Opinion issued in related Application Serial No. PCT/US2021/064436 dated Mar. 1, 2022.
First Notice of International Application issued in PCT/US2021/064436 dated Feb. 16, 2023.

* cited by examiner

SYSTEM AND METHOD FOR COOLING HIGH POWER ELECTRICAL SYSTEMS

RELATED APPLICATIONS

The subject application claims the benefit of U.S. Provisional Application having Ser. No. 63/220,755, filed 12 Jul. 2021. The entire content of which is herein incorporated by reference.

TECHNICAL FIELD

The present disclosure generally applies to cooling systems for use with high powered electrical systems.

BACKGROUND

With the increase in currents required to drive and charge electric vehicles, there is an increased need to cool the components that carry these currents. Existing solutions use die-casted aluminum or machined liquid cold plates, which require large tooling investments and a high cost of components. While these solutions may be suitable for high volume production, the need for a casting tool makes low volume production very expensive and changes to the box design require expensive and time-consuming changes to the casting tools.

There is a growing trend for the adoption of electrified drive train applications in construction, off-road and agricultural equipment. The ramp-up is slower compared to electric passenger vehicles and more flexibility is needed in these applications, as there are many versions that may require modified packaging of the electrification components. At the same time, final design samples are needed shortly after a project nomination and the time to design and build liquid cooling systems is very short. The target cost of these designs can also be very aggressive, and the charging powers required in these markets can be much greater than those needed in passenger vehicle application, with power targets up to 1.5 megawatts and higher.

SUMMARY OF THE DISCLOSURE

The details of one or more example implementations are set forth in the accompanying drawings and the description below. Other possible example features and/or possible example advantages will become apparent from the description, the drawings, and the claims. Some implementations may not have those possible example features and/or possible example advantages, and such possible example features and/or possible example advantages may not necessarily be required of some implementations.

In one implementation, a method for manufacturing an electrical cooling apparatus is provided. The method may include forming a first entirely solid metal plate to generate an enclosure. The method may also include affixing a bottom metal plate to the first entirely solid metal plate, the bottom metal plate may define a channel system. The bottom metal plate may include one or more inlet openings into the channel system, where the one or more inlet openings are configured to allow coolant to enter or exit the channel system.

Some or all of the following features may be included. The method may also include affixing an intermediate metal plate between the first entirely solid metal plate and the bottom metal plate, the intermediate metal plate may define the channel system with the bottom plate. At least one of the first entirely solid metal plate, the intermediate metal plate, and the bottom metal plate may have a thickness of less than 3 mm. At least one of the first entirely solid metal plate, the intermediate metal plate, and the bottom metal plate may be constructed of stainless steel. The method may further include welding or gluing together the first entirely solid metal plate, the intermediate metal plate, and the bottom metal plate. The cooling channel may have a non-uniform width. The bottom metal plate may be stamped to define the cooling channel. The one or more inlet openings may include two openings. A first opening may be at a first end of the cooling channel and a second opening may be at a second end of the cooling channel. The method may also include affixing a plurality of side portions to the first metal plate. The method may also include inserting an insulator layer between the first metal plate and one or more electrical components. At least one of the side portions may include an opening.

In another implementation, an electrical cooling apparatus is provided. The apparatus may include a first entirely solid metal plate forming an enclosure. The apparatus may further include a bottom metal plate affixed to the first entirely solid metal plate, and the bottom metal plate may define a channel system configured to allow coolant to flow therethrough. The bottom metal plate may include one or more inlet openings into the channel system, where the one or more inlet openings are configured to allow coolant to enter or exit the channel system.

Some or all of the following features may be included. The apparatus may also include an intermediate metal plate affixed between the first entirely solid metal plate and the bottom metal plate, the intermediate metal plate may define the channel system with the bottom metal plate. At least one of the first entirely solid metal plate, the intermediate metal plate, and the bottom metal plate may have a thickness of less than 3 mm. At least one of the first entirely solid metal plate, the intermediate metal plate, and the bottom metal plate may be constructed of stainless steel. The first entirely solid metal plate, the intermediate metal plate, and the bottom metal plate may be affixed together using welding or gluing. The cooling channel may have a non-uniform width. The bottom metal plate may be stamped to define the cooling channel. The one or more inlet openings may include two openings. The first opening may be at a first end of the cooling channel and a second opening may be at a second end of the cooling channel. A plurality of side portions may be affixed to the first metal plate. The apparatus may also include an insulator layer between the first metal plate and one or more electrical components. At least one of the side portions may include an opening.

This summary is provided to introduce a selection of concepts that are further described below in the detailed description. This summary is not intended to identify essential features of the claimed subject matter, nor is it intended to be used as an aid in limiting the scope of the claimed subject matter.

BRIEF DESCRIPTION OF THE DRAWINGS

Embodiments of the present disclosure are described with reference to the following figures.

Like reference symbols in the various drawings may indicate like elements.

DETAILED DESCRIPTION

The subject disclosure relates to liquid cooling systems for high voltage electronics, and more specifically to liquid cooling systems for high voltage junction boxes used in lithium-ion battery, charging, and power distribution systems. Embodiments included herein address many of the issues of existing systems and provides a cooling system design that allows for a fast turnaround of parts, more flexibility in outside dimensions and internal layouts, while maintaining high cooling performance and low cost. According to various embodiments, a casted aluminum box may be replaced with one that is made of bended and welded sheets of stainless steel (or other metals) to house the high-powered electric components and a liquid structure is provided on the outside. Embodiments included herein provide a novel method of manufacturing as well as a resulting apparatus that addresses the limitations of existing approaches.

The discussion below is directed to certain implementations. It is to be understood that the discussion below is only for the purpose of enabling a person with ordinary skill in the art to make and use any subject matter defined now or later by the patent "claims" found in any issued patent herein.

It is specifically intended that the claimed combinations of features not be limited to the implementations and illustrations contained herein, but include modified forms of those implementations including portions of the implementations and combinations of elements of different implementations as come within the scope of the following claims. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the claimed invention unless explicitly indicated as being "critical" or "essential."

It will also be understood that, although the terms first, second, etc. may be used herein to describe various elements, these elements should not be limited by these terms. These terms are only used to distinguish one element from another. For example, a first object or step could be termed a second object or step, and, similarly, a second object or step could be termed a first object or step, without departing from the scope of the invention. The first object or step, and the second object or step, are both objects or steps, respectively, but they are not to be considered a same object or step.

Figure 1:
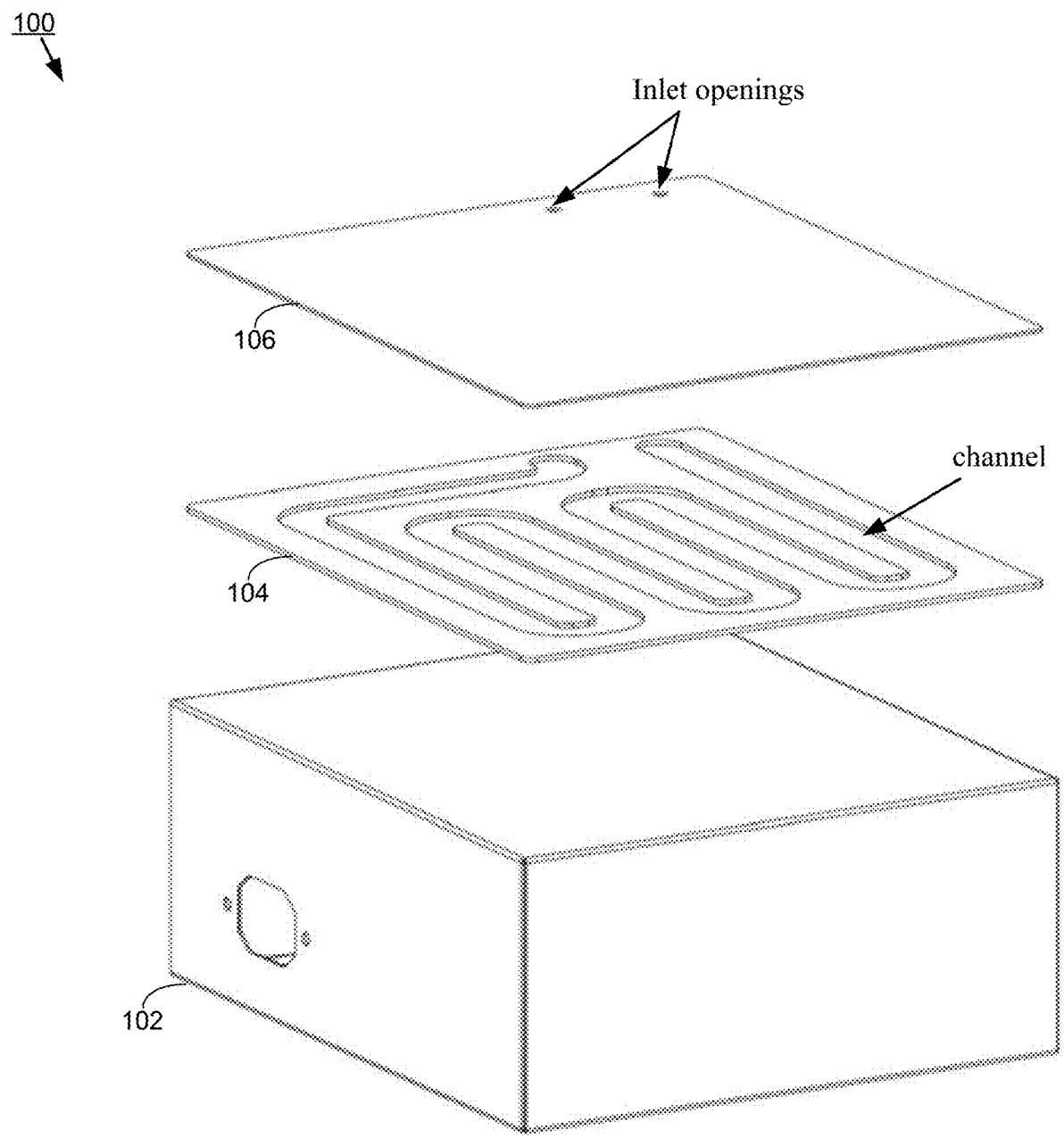
FIG. 1 is a view of a liquid cooling system according to embodiments of the subject technology.

Referring now to FIG. 1, an electrical cooling apparatus 100 consistent with embodiments of the present disclosure is provided. In some embodiments, apparatus 100 may include a first entirely solid metal plate 102 forming an enclosure. An intermediate metal plate 104 may be affixed to the first entirely solid metal plate 102. Intermediate metal plate 104 may be configured to define a channel system that may be configured to allow coolant to flow therethrough. Apparatus 100 may further include a bottom metal plate 106 affixed to intermediate metal plate 104. In some embodiments, bottom metal plate 106 may include one or more inlet openings into the channel system.

In some embodiments, first entirely solid metal plate 102 may be configured to form part of a folded metal box that forms the housing of the electrical components. To that box, the electrical connectors, the connection to the liquid cooling system, and the mechanical mounting features for the complete assembly may be fixed.

In some embodiments, one or more of plates 102, 104, and/or 106 may be constructed of stainless steel, which allows for cooling very near the hot spots while also being strong enough to carry the necessary electrical components. The coefficient of thermal expansion of stainless steel is similar to that of the copper conductors, which adds integrity to the design. As the plates are relatively thin (e.g., a range of approximately 0.2 mm-3.0 mm) the cooling medium may be brought in very close proximity to the copper conductors by which a very effective cooling is obtained.

Accordingly, in some embodiments, at least one of first entirely solid metal plate 102, intermediate metal plate 104, and bottom metal plate 106 may have a thickness of less than 3 mm. Similarly, at least one of first entirely solid metal plate 102, intermediate metal plate 104, and bottom metal plate 106 may be constructed of stainless steel. Some or all of these components may be affixed together using any suitable approach, including, but not limited to, welding, gluing, etc.

In some embodiments, first entirely solid metal plate 102 may be configured to provide a closed surface on which to mount electrical components (e.g., connectors, contactors, fuses, etc.). On the other side of first entirely solid metal plate 102, a channel may be formed by a sandwich of intermediate metal plate 104, which may include a structured plate (including the cooling channel structure) and bottom metal plate 106. In some embodiments, a metal cooling structure may be welded, glued or secured by other similar means to first entirely solid metal plate 102. In other embodiments, the cooling channel may be formed by one or more plates where the one or more plates are shaped to form the channels. For example, bottom metal plate 106 may include channels and may be affixed directly to first entirely solid metal plate 102 (see, e.g., FIG. 2).

In some embodiments, the cooling channel may have a uniform width, non-uniform width, and/or partial uniform and partial non-uniform width. Accordingly, the location and shape of the channel may be selected depending upon the electrical components shape, location and associated power characteristics within the enclosure.

In some embodiments, the one or more inlet openings may include any suitable number including the two openings depicted in FIG. 1. The first opening may be at a first end of the cooling channel and a second opening may be at a second end of the cooling channel, however, any locations and number may be used without departing from the scope of the present disclosure. While the term inlet opening is used to describe the opening, it should be appreciated the inlet opening may be configured as an outlet opening depending on the direction of flow of coolant. A plurality of side portions may be affixed to the first entirely solid metal plate 102. At least one of the side portions may include an opening as is shown in FIG. 1.

Figure 2:
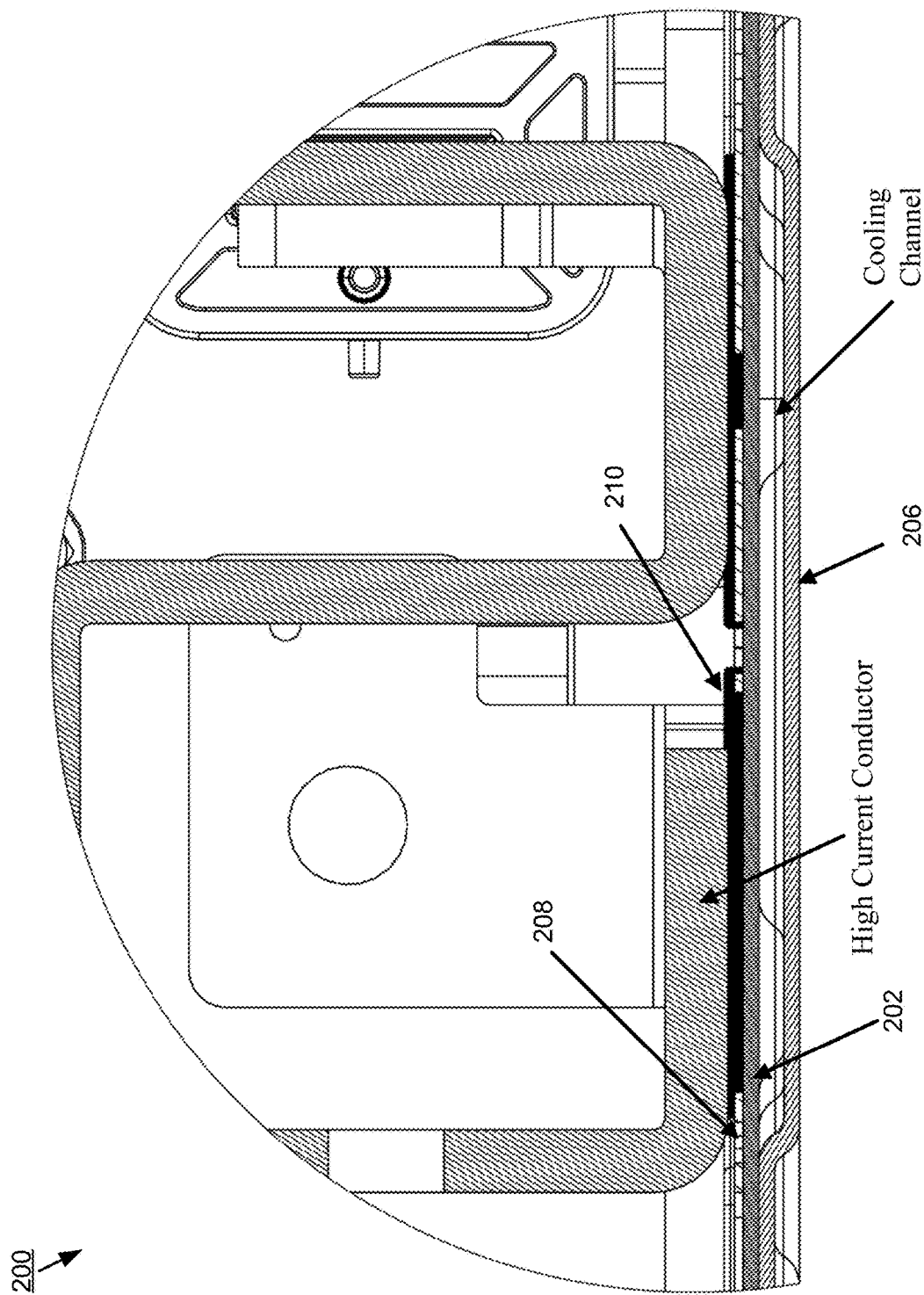
FIG. 2 is a cross-sectional view of a liquid cooling system according to embodiments of the subject technology.
Figure 3:
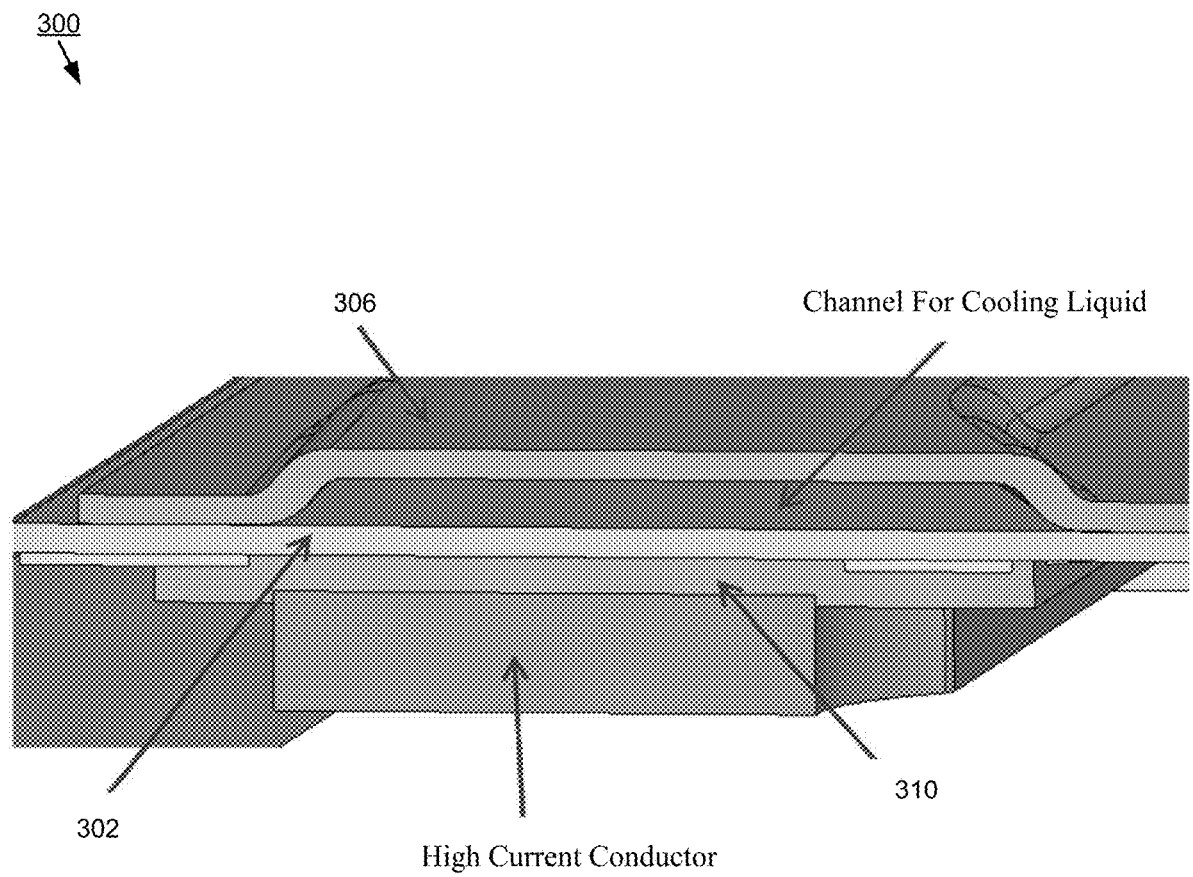
FIG. 3 is another cross-sectional view of a liquid cooling system according to embodiments of the subject technology.

Referring also to FIGS. 2-3, electrical cooling apparatus 200 and electrical cooling apparatus 300 consistent with embodiments of the present disclosure are provided. Apparatus 200 includes first entirely solid metal plate 202 and bottom metal plate 206. In some embodiments, bottom metal plate 206 includes the defined cooling channel. The defined cooling channel may be stamped into bottom metal plate 206. Apparatus 200 further includes insulator layer 208 and isolator/thermal conductor 210, which may include a liquid gap filler or similar. In some embodiments, bottom metal plate 206 may include a sheet of metal, such as stainless steel that may be placed between first entirely solid metal plate 202 and the high current components. In operation, bottom metal plate 206 may operate as one part of the cooling channel and separates the coolant from the components that require cooling when carrying a high current at high voltage levels. Electrically isolating, thermally conducting layer 210 may be placed in between bottom metal plate 206 and the high current conductor.

As shown in FIG. 2, on top of first entirely solid metal plate 202, the high voltage high current carrying components may be mounted with their current carrying (usually copper) conductors in thermal contact with first entirely solid metal plate 202. A thin electrically isolating thermal conducting layer 210 may be placed in between.

In operation, the cooling may be achieved by mounting high voltage, high current carrying components to first entirely solid metal plate 202 (either the bottom (or top) plate of the box) with their current carrying conductors (such as copper) in thermal contact with first entirely solid metal plate 202. A thin electrically isolating thermal conducting layer 210 may be located in between first entirely solid metal plate 202 and the high current conductor. The cooling channel may allow cooling liquid to flow therethrough, thus transferring heat away from the components on the other side of first entirely solid metal plate 202. Since first entirely solid metal plate 202 has no holes or seals, the risk of liquid contacting the high voltage components is mitigated. The continuous surface also provides the freedom to design the channels in various ways to pass closely to all hot spots on the other side. These make it easy to deal with changes in internal layouts as well as to provide cooling close to the hot spots. Sheet metal also allows for the designing of thin and light weight parts as opposed to casting where minimum wall thickness imposed by the casting process is required.

Figure 4:
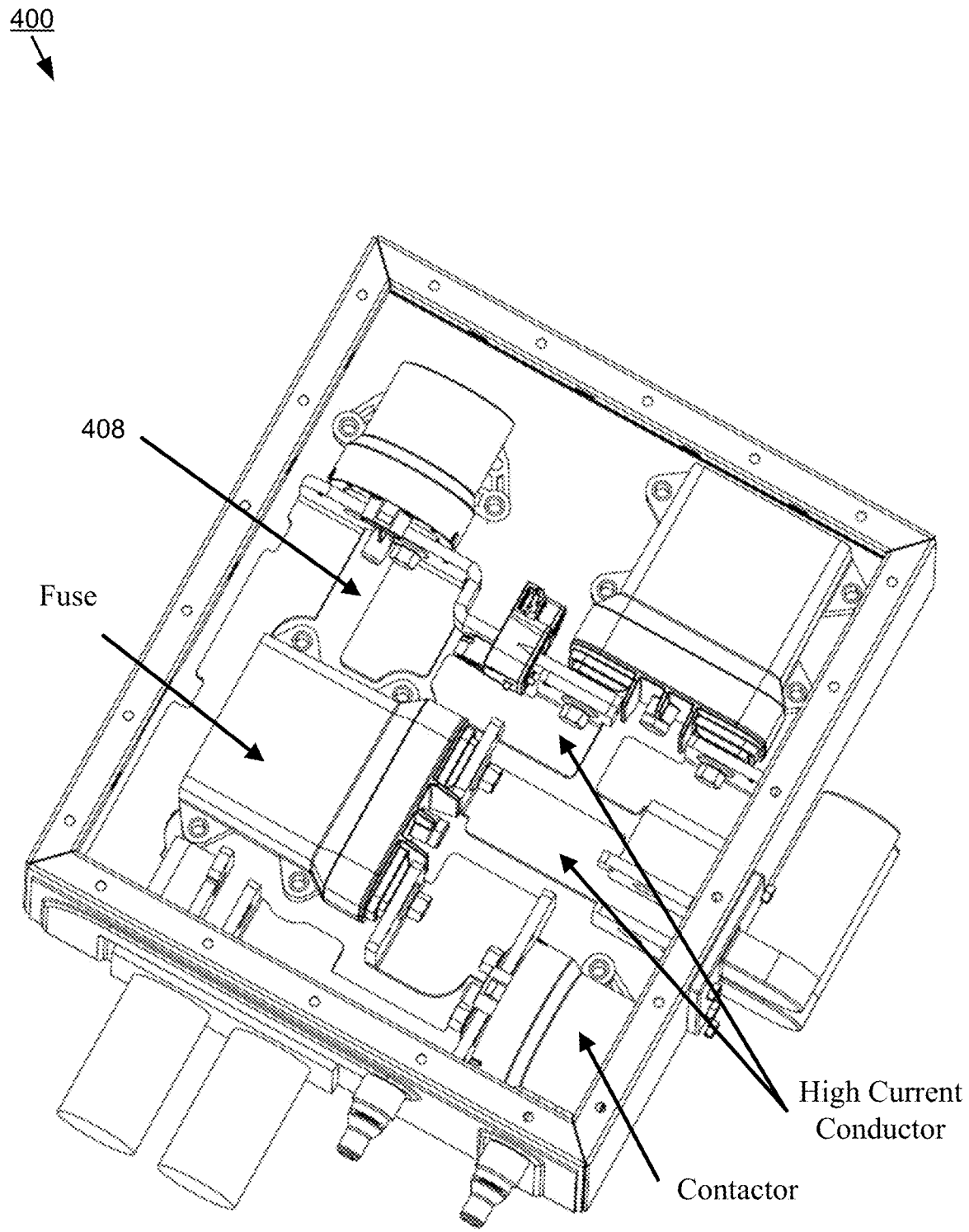
FIGS. 4-5 show schematics of a liquid cooling system according to embodiments of the subject technology.
Figure 5:
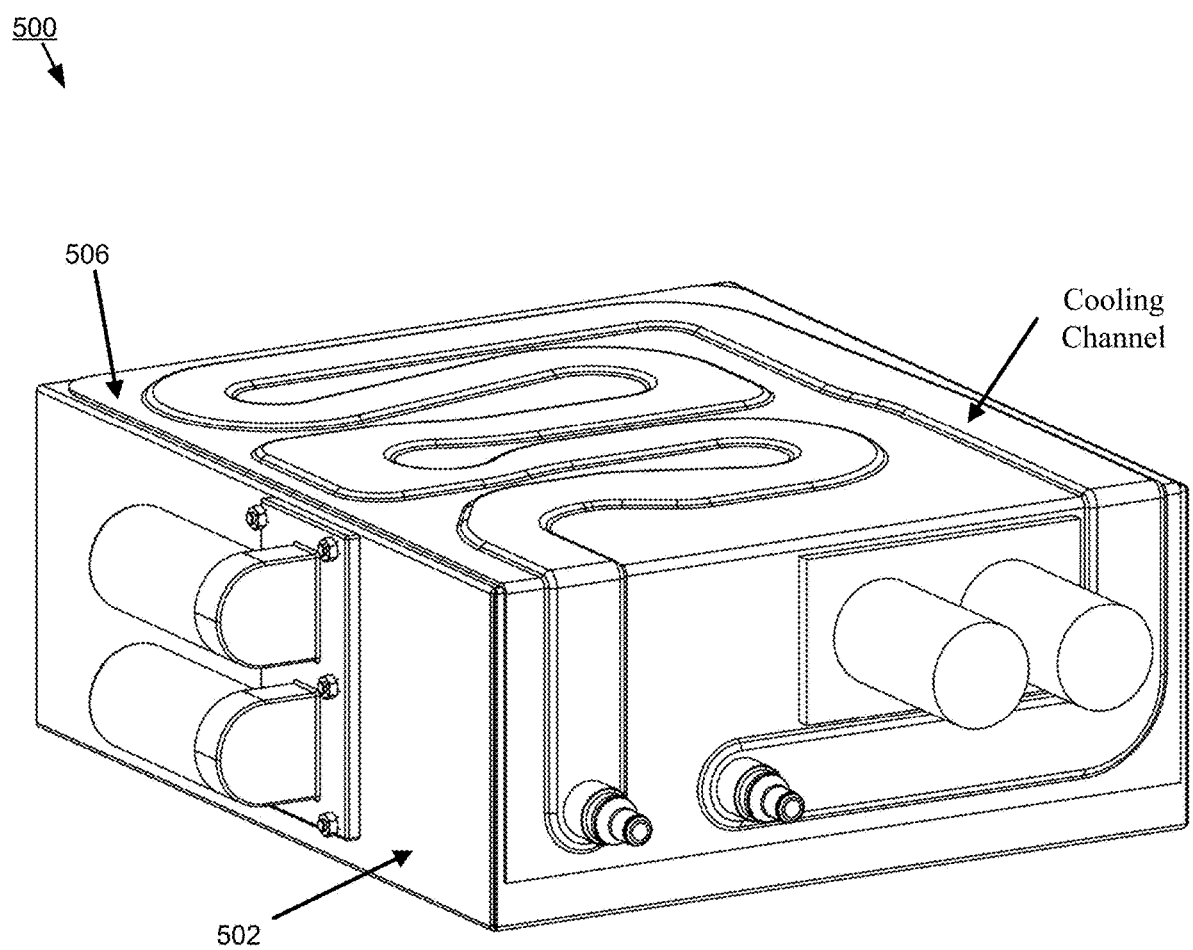

Referring now to FIGS. 4-5, embodiments of the liquid cooling system include an enclosure for high current carrying components with an integrated cooler. FIG. 4 depicts insulator layer 408 as well as fuses, high current conductors, and contactors. By maximizing the thermal contact between the conductors and the bottom plate of first entirely solid metal plate 502, the electrical components may be effectively cooled by the cooler on the outside of the enclosure. The continuous surface of the cooling plate allows for complex shapes of the cooling channel that is able to reach all the hot spots on first entirely solid metal plate, thereby providing effective cooling to the internal components inside the enclosure. FIG. 5 depicts one particular embodiment where the cooling channel is located both on the bottom portion of first entirely solid metal plate 502 and also along one or more of the side portions of first entirely solid metal plate 502. Accordingly, the one or more inlet openings in this particular example may also be provided along the one or more side portions of first entirely solid metal plate 502. As shown in FIG. 5, bottom metal plate 506 may include the cooling channel located along one or more of the side portions. In other embodiments, intermediate metal plate may include some or all of the cooling channel and be affixed between first entirely solid metal plate 502 and bottom metal plate 506.

Figure 6:
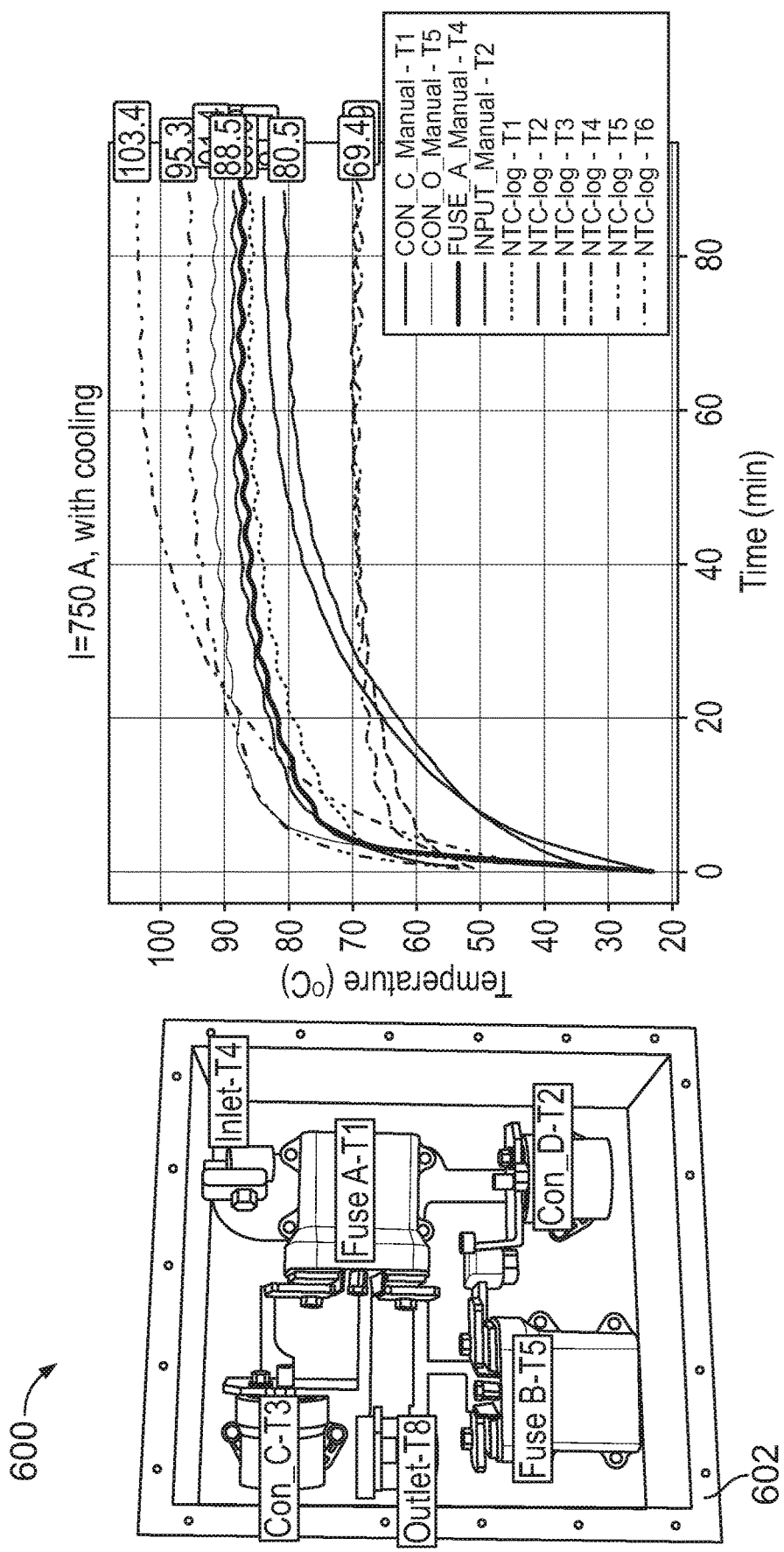
FIG. 6 shows a graph of the cooling performance levels in a liquid cooling system according to embodiments of the subject technology.

Referring now to FIG. 6 a graph of the cooling performance seen in a design according to the subject technology is provided. In this particular example, the thermal measurement points are indicated in the apparatus on the left and the graph details the measured performance at a current of 750 A at 25° Celsius ambient temperature with the cooling liquid kept at 25° Celsius. In this example, 535 W of heat was generated in the box and all the components stay within 104° Celsius, which is within the thermal specifications required at this current level.

Figure 7:
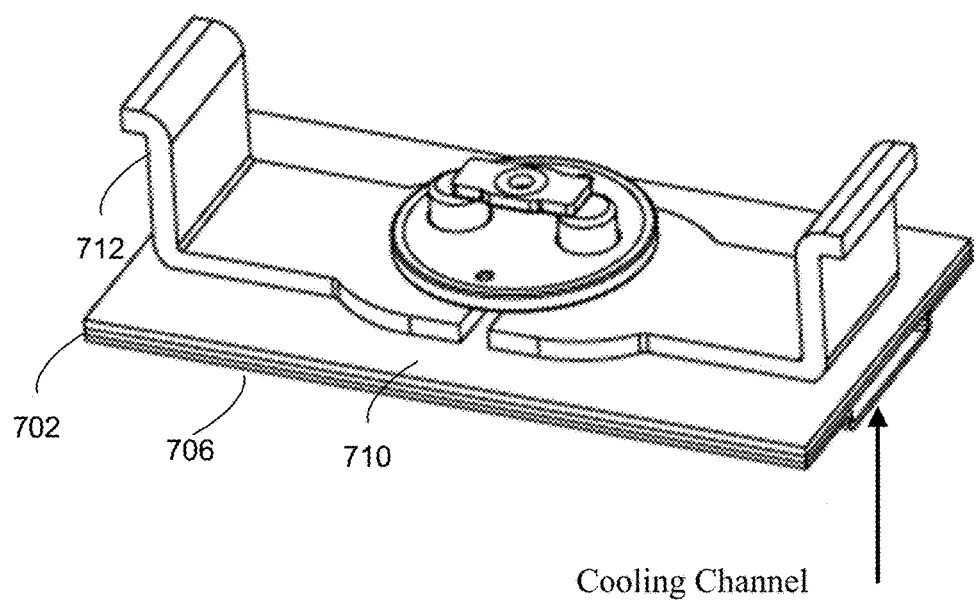
FIGS. 7-8 show multiple views of a liquid cooling system according to embodiments of the subject technology.
Figure 7:
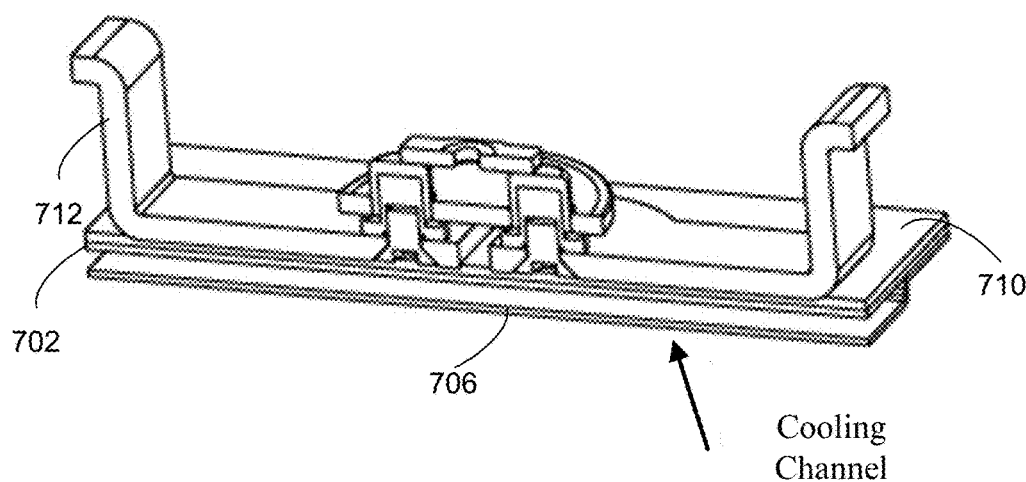
Figure 8:
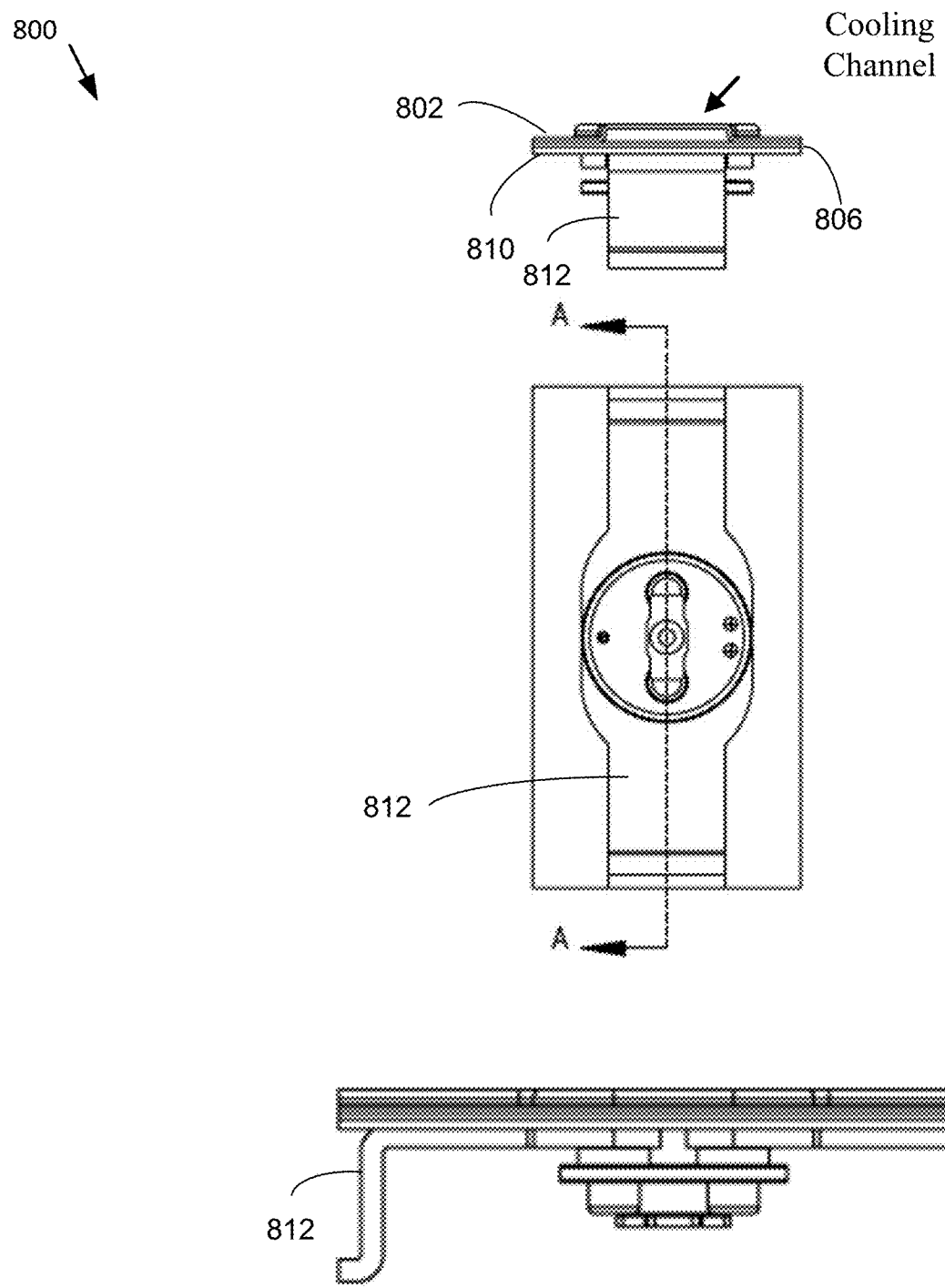

Referring now to FIGS. 7-8, different views of a diagram in accordance with an embodiment of the present disclosure is provided. In this particular example, the stationaries of a contactor (or fuse) are mounted vertically in which the cooling channels are brought as close as possible to a contactor component 712. Sunken bolts may be buried in the busbar to prevent them from making a short circuit to the box with the advantage of keeping a straight shape for the box. Contactor component 712 may be affixed to electrically isolating, thermally conducting layer 710. Electrically isolating, thermally conducting layer 710 may be affixed to first entirely solid metal plate 702, which in turn is affixed to bottom metal layer 706. As show in FIGS. 7-8, bottom metal layer 706 may include the cooling channels. In some embodiments, the cooling channels may run parallel with the stationaries of contactor component 712 on the opposite side of first entirely solid metal plate 702. In other embodiments, the cooling channels may make multiple cooling passes by contactor component 712 on the opposite side of first entirely solid metal plate 702.

Embodiments of the present disclosure may further include a method of manufacturing the electrical cooling apparatus discussed above. In operation, this may include forming first entirely solid metal plate 102 to generate an enclosure and affixing intermediate metal plate 104 to first metal plate 102. The method may include designing and/or constructing a cooling channel within intermediate metal plate 104. As previously discussed, in some embodiments, bottom metal plate 106 may be designed and/or constructed with a cooling channel. In such embodiments, the cooling channel in bottom metal plate 106 may allow for the coolant to flow between bottom metal plate 106 and first entirely solid metal plate 102 and thereby intermediate metal plate 104 may be omitted. The location and shape of the cooling channel may be based upon, at least in part, the types of electronics that may be included within the enclosure formed by first entirely solid metal plate 102. The method may also include affixing bottom metal plate 106 to intermediate metal plate 104. In some embodiments the method may include affixing bottom metal plate 106 to first entirely solid metal plate 102. Bottom metal plate 106 may be constructed to include one or more inlet openings into the channel system, which may be configured to allow coolant to enter the channel system.

In some embodiments, the method may include inserting an insulator layer 208 between first entirely solid metal plate 102 and one or more electrical components. The method may further include welding or gluing together the first entirely solid metal plate 102, intermediate metal plate 104, and bottom metal plate 106. The method may also include affixing a plurality of side portions to first entirely solid metal plate 102.

Embodiments of the present disclosure enable a wide variety of differently shaped liquid cooled boxes to be made with minimal tooling cost and short lead times. It also allows the cooler to be easily adapted to different internal layouts to ensure efficient cooling at the hottest locations by cooling directly under components that get hot. Embodiments disclosed herein include design flexibility as the size of the cold plate may be modified easily as well as the routing of the cooling channels. The designs can be produced in many workshops without a large investment in tooling cost.

As used in any embodiment described herein, the term "circuitry" may comprise, for example, singly or in any combination, hardwired circuitry, programmable circuitry, state machine circuitry, and/or firmware that stores instructions executed by programmable circuitry. It should be understood at the outset that any of the operations and/or operative components described in any embodiment or embodiment herein may be implemented in software, firmware, hardwired circuitry and/or any combination thereof.

The terminology used herein is for the purpose of describing particular embodiments and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

Although a few example embodiments have been described in detail above, those skilled in the art will readily appreciate that many modifications are possible in the example embodiments without materially departing from the scope of the present disclosure, described herein. Accordingly, such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words 'means for' together with an associated function.

Having thus described the disclosure of the present application in detail and by reference to embodiments thereof, it will be apparent that modifications and variations are possible without departing from the scope of the disclosure defined in the appended claims.

What is claimed is:

1. A method for manufacturing an electrical cooling apparatus comprising:
   forming a first entirely solid metal plate to generate an enclosure; and
   affixing a bottom metal plate to the first entirely solid metal plate, the bottom metal plate defining a first channel, the bottom metal plate including one or more inlet openings into the first channel, wherein a second channel is defined along one or more sidewalls included in the enclosure of the first entirely solid metal plate, the second channel configured to interconnect with the first channel defined along the bottom metal plate, wherein the one or more inlet openings are configured to allow coolant to enter or exit the first channel, and wherein the first channel is defined by a bottom portion of the first entirely solid metal plate and the second channel is defined by a side portion of the first entirely solid metal plate.

2. The method of claim 1, further comprising: affixing an intermediate metal plate between the first entirely solid metal plate and the bottom metal plate, the intermediate metal plate defining the first channel with the bottom plate.

3. The method of claim 2, wherein at least one of the first entirely solid metal plate, the intermediate metal plate, and the bottom metal plate has a thickness of less than 3 mm.

4. The method of claim 2, wherein at least one of the first entirely solid metal plate, the intermediate metal plate, and the bottom metal plate is constructed of stainless steel.

5. The method of claim 2, further comprising: welding or gluing together the first entirely solid metal plate, the intermediate metal plate, and the bottom metal plate.

6. The method of claim 1, wherein the first channel has a non-uniform width.

7. The method of claim 1, wherein the bottom metal plate is stamped to define the first channel.

8. The method of claim 1, wherein the one or more inlet openings include two openings, wherein a first opening is at a first end of the first channel and a second opening is at a second end of the first channel.

9. The method of claim 1, further comprising: affixing a plurality of side portions to the first metal plate.

10. The method of claim 1, further comprising: inserting an insulator layer between the first metal plate and one or more electrical components.

11. An apparatus comprising:
    a first entirely solid metal plate forming an enclosure; and
    a bottom metal plate affixed to the first entirely solid metal plate, the bottom metal plate defining a first channel configured to allow coolant to flow therethrough, the bottom metal plate including one or more inlet openings into the first channel, wherein a second channel is defined along one or more sidewalls included in the enclosure of the first entirely solid metal plate, the second channel configured to interconnect with the first channel defined along the bottom metal plate, wherein the one or more inlet openings are configured to allow coolant to enter or exit the first channel system, and wherein the first channel is defined by a bottom portion of the first entirely solid metal plate and the second channel is defined by a side portion of the first entirely solid metal plate.

12. The apparatus of claim 11, further comprising: an intermediate metal plate affixed between the first entirely solid metal plate and the bottom metal plate, the intermediate metal plate defining the first channel with the bottom metal plate.

13. The apparatus of claim 12, wherein at least one of the first entirely solid metal plate, the intermediate metal plate, and the bottom metal plate has a thickness of less than 3 mm.

14. The apparatus of claim 12, wherein at least one of the first entirely solid metal plate, the intermediate metal plate, and the bottom metal plate is constructed of stainless steel.

15. The apparatus of claim 12, wherein the first entirely solid metal plate, the intermediate metal plate, and the bottom metal plate are affixed together using welding or gluing.

16. The apparatus of claim 11, wherein the first channel has a non-uniform width.

17. The apparatus of claim 11, wherein the bottom metal plate is stamped to define the first channel.

18. The apparatus of claim 11, wherein the one or more inlet openings include two openings, wherein a first opening is at a first end of the first channel and a second opening is at a second end of the first channel.

19. The apparatus of claim 11, further comprising: a plurality of side portions affixed to the first metal plate.

20. The apparatus of claim 11, further comprising: an insulator layer between the first metal plate and one or more electrical components.

* * * * *